United States Patent
Chen

(10) Patent No.: US 12,376,255 B2
(45) Date of Patent: Jul. 29, 2025

(54) QUICK MOUNT BRACKET FOR SERVER CHASSES

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 41 days.

(21) Appl. No.: 18/540,810

(22) Filed: Dec. 14, 2023

(65) Prior Publication Data
US 2025/0203805 A1 Jun. 19, 2025

(51) Int. Cl.
*H05K 7/14* (2006.01)

(52) U.S. Cl.
CPC ................. *H05K 7/1489* (2013.01)

(58) Field of Classification Search
CPC .................................................... H05K 7/1489
See application file for complete search history.

(56) References Cited

U.S. PATENT DOCUMENTS

| 2011/0233362 A1* | 9/2011 | Peng | H05K 7/1489 248/316.8 |
| 2013/0259411 A1* | 10/2013 | Judge | F16C 29/04 384/49 |
| 2014/0263907 A1* | 9/2014 | Mason | G06F 1/187 248/300 |
| 2021/0267084 A1* | 8/2021 | Anderson | H04Q 1/06 |

FOREIGN PATENT DOCUMENTS

TW 532499 5/2003

* cited by examiner

Primary Examiner — Farzana B Huq
(74) Attorney, Agent, or Firm — Fei-hung Yang

(57) ABSTRACT

A quick mount bracket for server chasses includes two movable frames, multiple quick fasteners, and two placing plates. After the quick mount bracket is installed in a computer cabinet, at least one placing space is formed for storing at least one server chassis in a straddle sliding manner. Each movable frame is formed by stacking two movable plates with each other to produce a relative displacement to change its length, the quick fasteners are disposed at two ends of each movable frame, inserted into the corresponding fixing holes, and respectively and symmetrically installed in the computer cabinet, each placing plate is fixed onto the inner side of each movable frame, and each placing plate has a side view in an L-shape. The size of the placing space can be changed as needed to fit various types of server chasses, which greatly improves the convenience of use and operation.

7 Claims, 5 Drawing Sheets

QUICK MOUNT BRACKET FOR SERVER CHASSES

BACKGROUND OF THE DISCLOSURE

Technical Field

The present disclosure relates to the field of a cabinet slide rail, more particularly relates to a quick mount bracket for server chasses, which forms at least one placing space after installation, and allows the server chasses to be stored in the placing space in a straddle sliding manner, and comes with the features of simplified structure and convenient operation.

Description of the Related Art

In general, server chasses are installed horizontally like drawers one by one inside a server cabinet with a rack vertically erected from four corners of the cabinet, and the surface of each rack is provided with a plurality of fixing holes or screw holes, so the industrial computers are traditionally mounted on the server cabinet by means of fixing blocks or fixing screws, etc. Obviously, the assembling and disassembling processes of the related art are time-consuming and labor-intensive, which is also inconvenient for servers that often need to be mounted onto or taken out from the server cabinet. For this reason, most of the server chassis installations in recent years are equipped with a slide rail structure that can be stretched and retracted in order to quickly push the server chassis into the server cabinet, or optionally pull the server chassis outward from the cabinet for expansion, replacement, or inspection, which greatly improves the convenience of the subsequent maintenance.

However, some of the server chasses do not need to be fixed in the server cabinet, and they just need to be connected to other servers and placed into the server cabinet. The design of the slide rail itself cannot be directly installed in the server cabinet, and thus it is also necessary to install and position the slide rail in the cabinet by a bracket and then connect and fix the slide rail, thus incurring a higher cost for the manufacture and installation. Obviously, it is really not an economical and practical approach for the servers that only require to be placed into the server cabinet. As disclosed in the R.O.C. Pat. No. 532499, entitled "Improved chute rod structure for servo system rack", this patent is characterized in that one or more wings are extended from two sides of a main system casing and linearly arranged and protruded from the main system casing; each chute rod includes a frame and two positioning rods; wherein the frame has a cross-section in an n-shape and a central plate with a plurality of elongated through holes; two positioning rods have a plurality of locking holes formed at their ends having the folded fixing plate, and the rod body has a plurality of screw holes; two positioning rods are installed to the front and rear ends of the n-shaped slot of the frame, and a plurality of screws is passed through a plurality of vents of the frame and then screwed to the screw holes to form a complete chute rod structure; the fixing plate of the two positioning rods abuts the inner side of an angle iron disposed at both front and rear ends of the inner side of the rack, and the screw is penetrated through an angle iron and screwed to the locking hole in order to fix the chute rod onto the rack; and the main system casing containing the electronic device is mounted onto the top surface of the n-shaped body of the frame by the wings on both sides, so that the chute rod can slide and move along the front and rear directions. In this way, the existing server chasses on the market must be reworked to produce the corresponding wing structure, which is a major difficulty. In addition, it is necessary to fix the n-shaped slot of the frame by the two positioning rods, which incurs higher cost and level of difficulty of the production, and thus such patent is not applicable to various existing server chasses, and requires further improvements.

In view of the drawbacks of the prior art, the present discloser based on years of experience in the related industry to conduct research and experiment, and finally developed a quick mount bracket for server chasses, which discloses a more economical way of mounting the server chasses into the server cabinet. The quick mount bracket for server chasses includes a pair of movable frames, a plurality of quick fasteners and a pair of placing plates, and the quick mount bracket is installed to a computer cabinet to form at least one placing space, such that the at least one server chassis is stored in the placing space in a straddle sliding manner, and the size of the placing space can be changed as needed to fit various types of server chasses, and greatly improve the convenience of use and operation.

SUMMARY OF THE DISCLOSURE

It is a primary objective of the present disclosure to provide a quick mount bracket for server chasses, which includes a pair of movable frames, a plurality of quick fasteners and a pair of placing plates, and the quick mount bracket is installed in a computer cabinet to form at least one placing space, such that at least one server chassis can be stored in the placing space in a straddle sliding manner, wherein each movable frame is formed by stacking two movable plates and capable of producing a relative displacement to change the length, the quick fasteners are respectively disposed at two ends of each movable frame, inserted into the fixing holes, and symmetrically installed in the computer cabinet, each placing plate is fixed to the inner side of each movable frame, and each placing plate has a side view in an L-shape. In addition, the size of the placing space can be changed as needed to fit various types of server chasses, which greatly improves the convenience of use and operation.

To achieve the aforementioned objective, the present disclosure discloses a quick mount bracket for server chasses, installed in a computer cabinet to form at least one placing space, such that at least one server chassis can be stored in the placing space in a straddle sliding manner, and the quick mount bracket for server chasses includes: a pair of movable frames, each being formed by stacking two movable plates, such that a relative displacement is produced between the two movable plates to change the length; a plurality of quick fasteners, installed to two ends of each movable frame respectively, each quick fastener comprising a plurality of positioning columns configured to be corresponsive to the a plurality of mounting holes formed on the computer cabinet, wherein after the length of movable frame is changed, the positioning columns are inserted into the mounting holes respectively, such that the two movable frames are respectively and symmetrically installed on two opposite sides of the computer cabinet; and a pair of placing plates, each being fixed to an inner side of each movable frame, having a side view in an L-shape, and forming the placing space for movably placing the server chassis.

In an embodiment of the present disclosure, one of the movable plates includes a positioning spring plate, and another movable plate includes a bracket positioning hole, such that one of the positioning spring plates can be passed through the bracket positioning hole to lock its length.

In an embodiment of the present disclosure, each quick fastener includes a fixed base, the pair of positioning columns is protruded from an end of the fixed base, and the fixed base includes a fixed part fixed to an end of the movable frame. In addition, the pair of positioning column is one selected from the group of a cylinder, a rectangular column and a combination of the above, and the pair of positioning columns includes a pair of elastic elements configured to be opposite to the fixed base, the elastic elements are retracted when pressed, and normally remain at a protruding state.

In another embodiment of the present disclosure, the surface of each placing plate is provided with a plurality of fixing holes to be fixed to the movable frame; and each placing plate includes a wing formed by bending an edge of the placing plate, so as to form the placing space with a side view in an L-shape. In order to increase the overall strength and carrying load capacity, the placing plate is equipped with a reinforcing folded part on another edge of the wing to increase the vertical supporting force of the placing plate; the reinforcing folded part is protruded from a surface of the placing plate to reduce the frictional area when the server chassis is put into the server cabinet, so as to make the sliding process more smoothly; and the wing at the position connected to the placing plate includes a plurality of reinforcing protrusions which are spaced from one another, and this design improves the overall effectiveness of use and the smoothness of operation.

DESCRIPTION OF THE PREFERRED EMBODIMENTS

The objectives, technical contents and features of this disclosure will become apparent in the following detailed description of the preferred embodiments with reference to the accompanying drawings.

Figure 1:
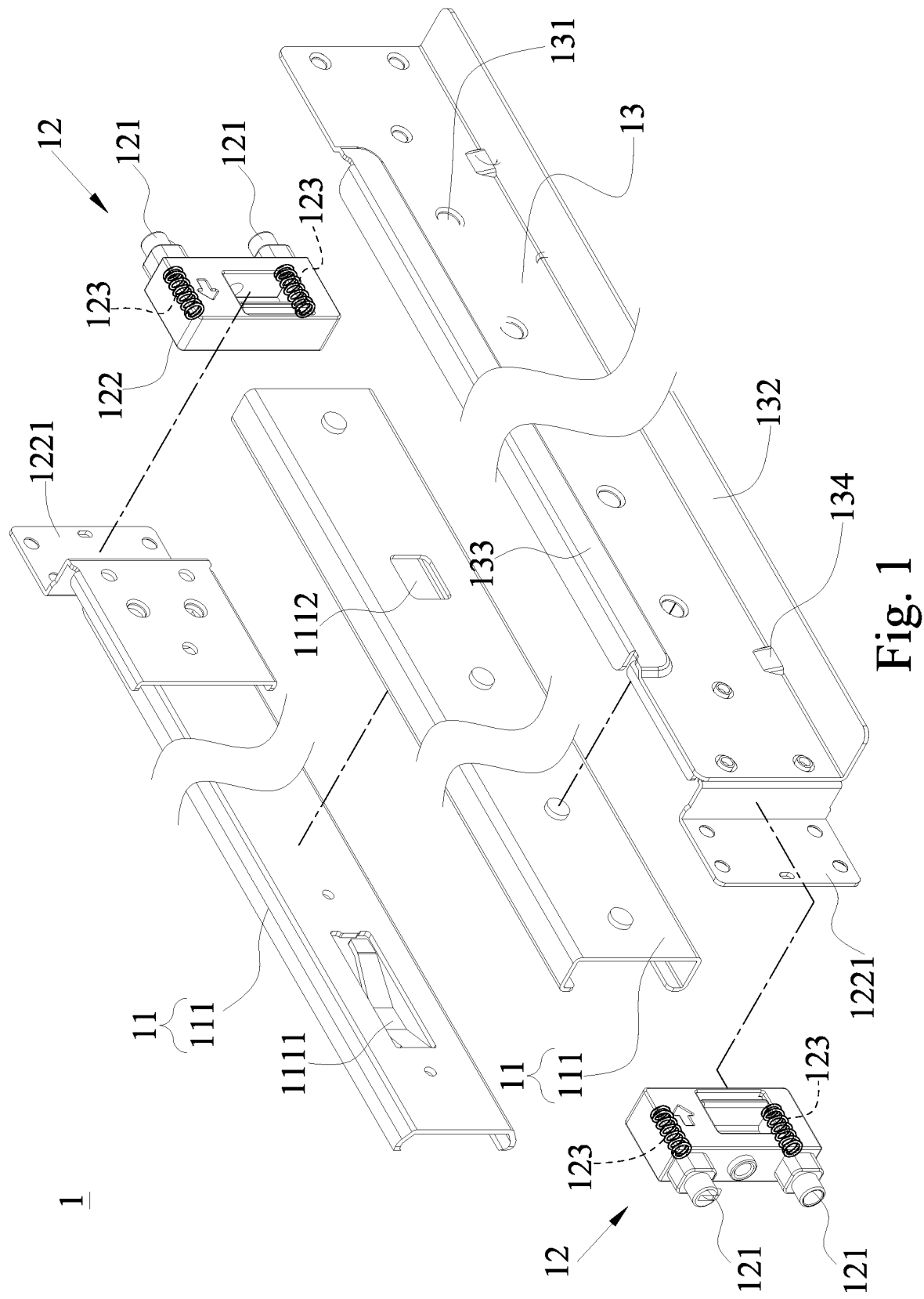
FIG. 1 is an exploded view of a preferred embodiment of the present disclosure.
Figure 2:
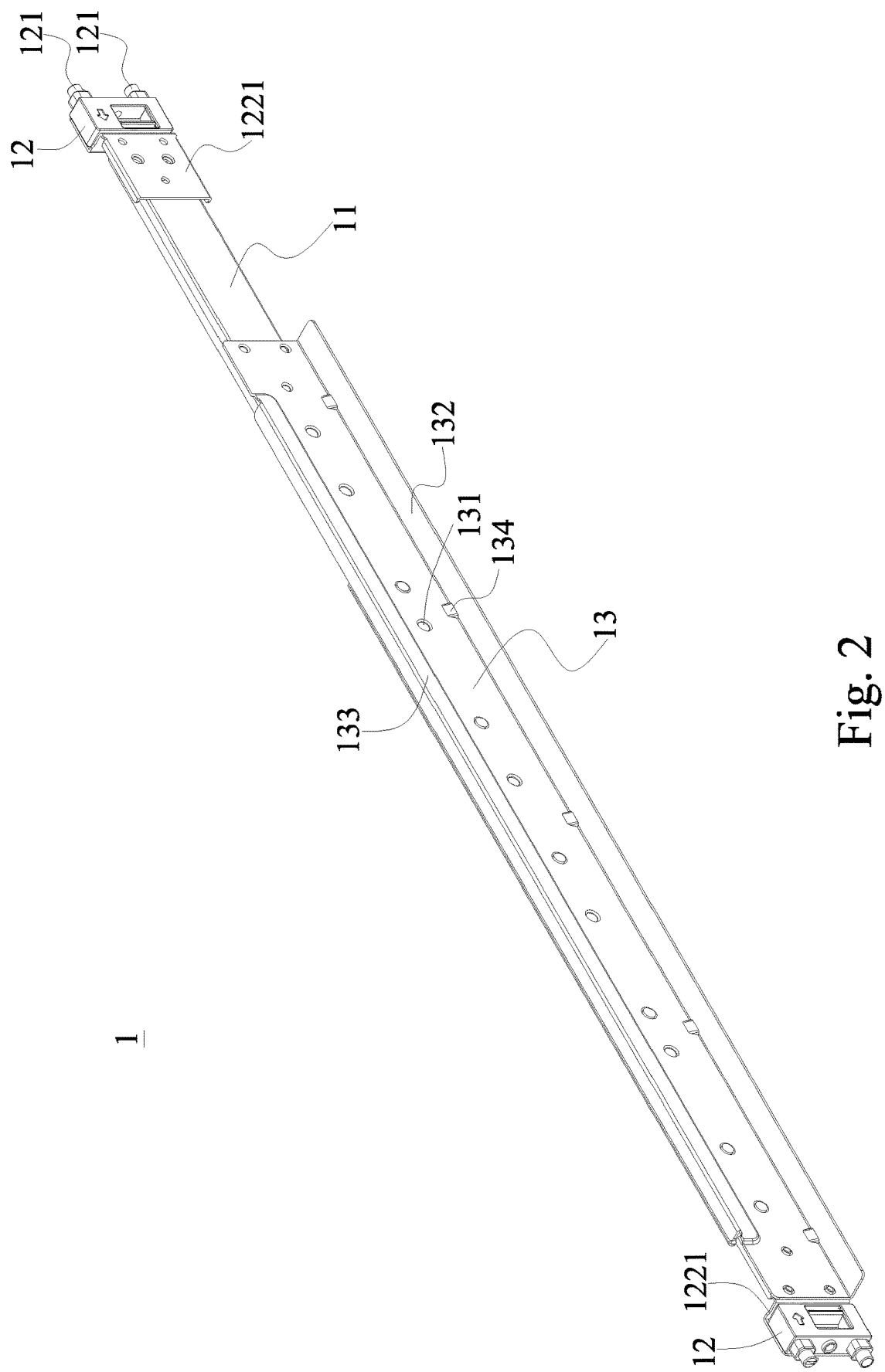
FIG. 2 is a perspective view of a preferred embodiment of the present disclosure.
Figure 3:
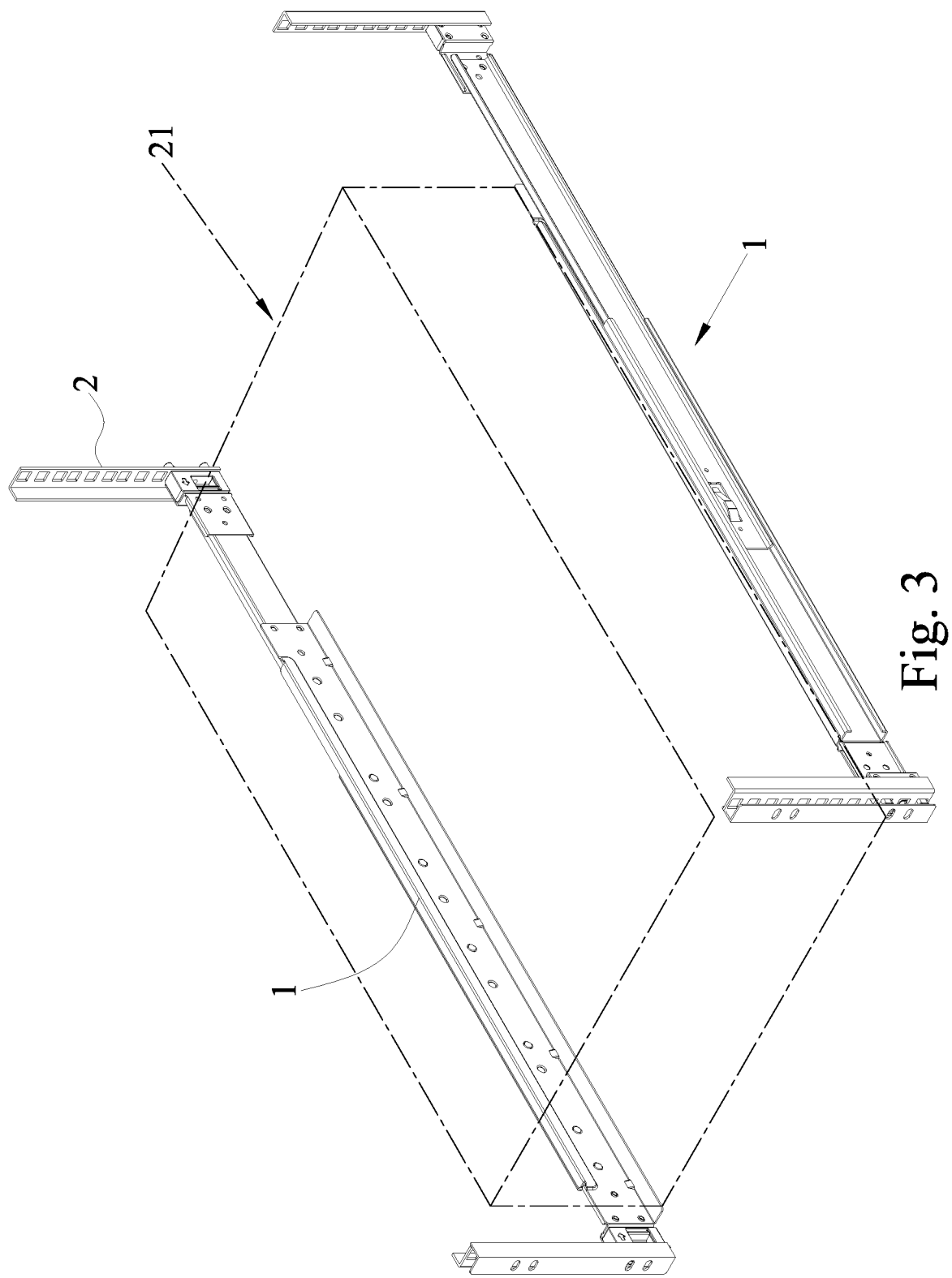
FIG. 3 is a schematic view showing the status of a preferred embodiment of the present disclosure during installation.
Figure 4:
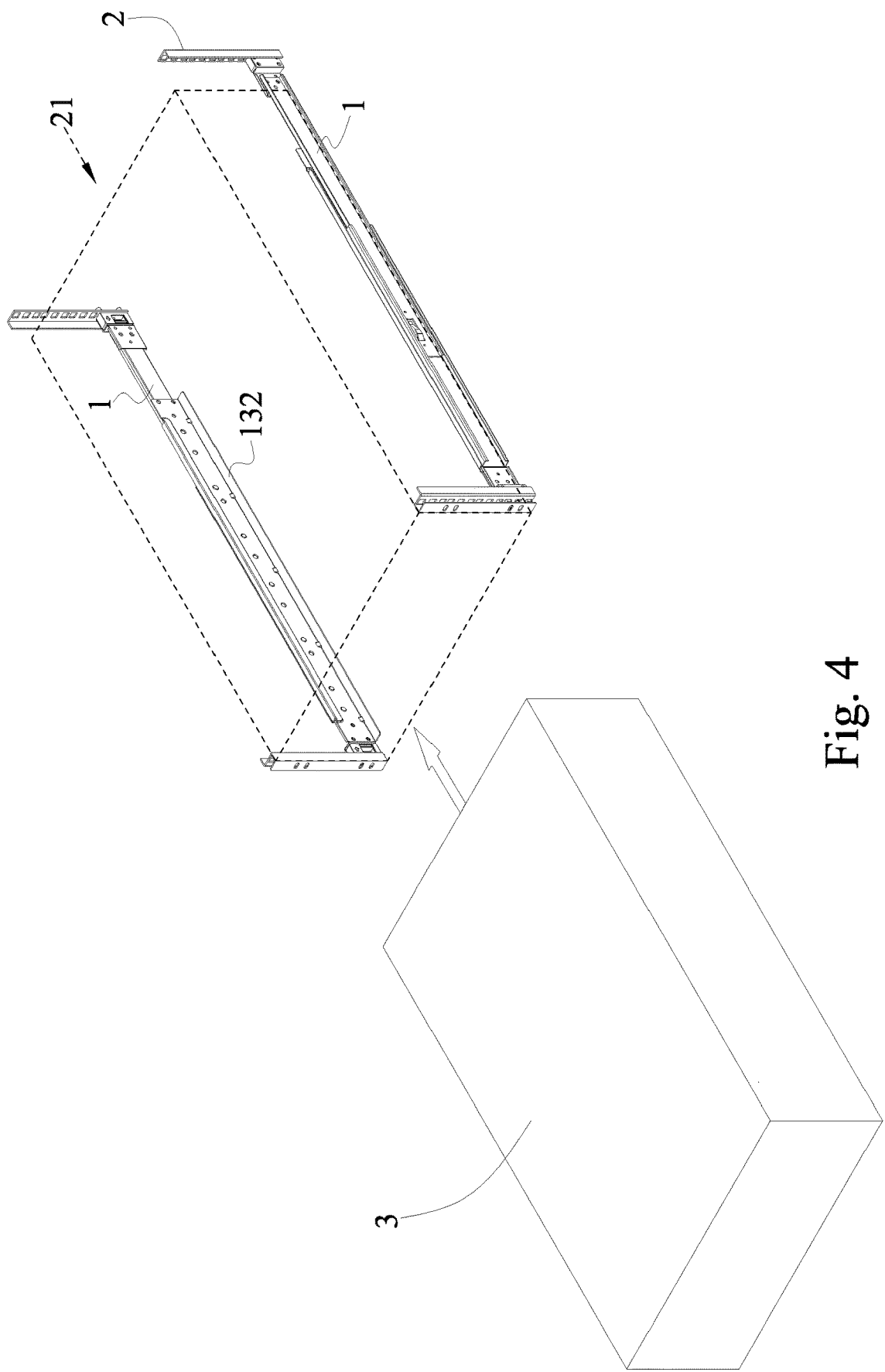
FIG. 4 is a first schematic view showing the operation of a preferred embodiment of the present disclosure during installation.
Figure 5:
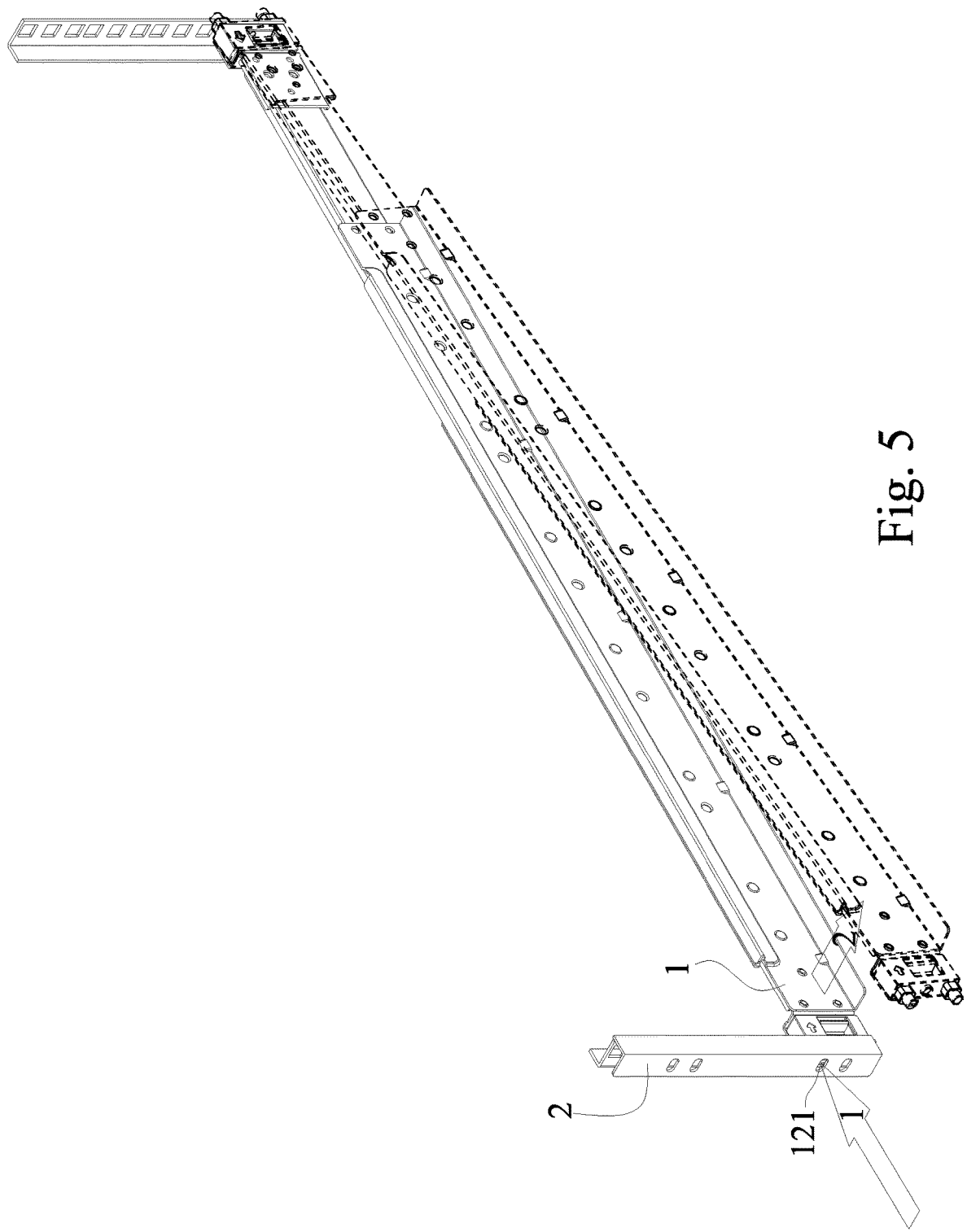
FIG. 5 is a second schematic view showing the operation of a preferred embodiment of the present disclosure during installation.

With reference to FIGS. 1, 2, 3 and 4~5 for the exploded view, the perspective view, the schematic views showing the status during installation, and the schematic view showing the operation during installation in accordance with a preferred embodiment of the present disclosure respectively, the present disclosure provides a quick mount bracket for server chasses 1 which includes a pair of movable frames 11, a plurality of quick fasteners 12 and a pair of placing plates 13, and the quick mount bracket is installed in a computer cabinet 2 to form at least one placing space 21, such that the at least one server chassis 3 can be stored in the placing space 21 in a straddle sliding manner.

Wherein, each movable frame 11 is formed by stacking two movable plates 111 with each other, such that a relative displacement can be produced between the two movable plates 111 to change the length. It is noteworthy that one of the movable plates 111 has a positioning spring plate 1111, and another movable plate 1111 has a bracket positioning hole 1112, such that during use, one of the positioning spring plates 1111 is passed through the bracket positioning hole 1112 to lock its length, or one of the movable plates 111 is wrapped into the other movable plate 111, and folds are added to the edge to avoid misalignment after installation. Such design provides a directional guide for the telescoping actions along the lengthwise direction.

The quick fasteners 12 are disposed at two ends of each movable frame 11 respectively, each quick fastener 12 has a plurality of mounting holes 22 configured to be corresponsive to the plurality of positioning columns 121 formed on the computer cabinet 2. After the length of the movable frame 11 is changed, the positioning columns 121 are inserted into the mounting holes 22 respectively, such that the two movable frames 11 are respectively and symmetrically installed to two opposite sides of the computer cabinet 2. It is noteworthy that each quick fastener 12 of this embodiment includes a fixed base 122, the pair of positioning columns 121 is protruded from an end of the fixed base 122, the fixed base 122 has a fixed part 1221 fixed to an end of the movable frame 11, the positioning columns 121 is one selected from the group of a cylinder, a rectangular column and a combination of the above, and the pair of positioning columns 121 includes a pair of elastic elements 123 configured to be corresponsive to the fixed base 122, such that the elastic elements 123 are retracted when pressed, and normally remain at a protruding state.

Each placing plate 13 is fixed to the inner side of each movable frame 11, and each placing plate 13 has a side view in an L-shape to form the placing space 21 for movably carrying and placing the server chassis 3. It is noteworthy that the surface of each placing plate 13 of the present disclosure is provided with a plurality of fixing holes 131 to be fixed to the movable frame 11, and an edge of each placing plate 13 is bent to form a wing 132, which has a side view in an L-shaped to form the placing space 21. In order to improve the strength and load carrying capacity, the other edge of the placing plate 13 having the wing 132 is stamped to form a reinforcing folded part 133 to enhance the supporting force of the placing plate 13 in the vertical direction. The reinforcing folded part 133 is protruded out from the surface of the placing plate 13 and capable of reducing the frictional area when putting in the server chassis 3, so as to make the sliding process more smoothly. The wing 132 at the position connected to the placing plate 13 has a plurality of reinforcing protrusions 134 which are spaced from each other.

In summation of the description above, the quick mount bracket for server chasses 1 in accordance with the present disclosure is installed to the computer cabinet 2 to form the placing space 21 provided for storing at least one server chassis 3 in the placing space 21 in a straddle sliding manner for quickly pulling and taking out the server chassis 3. At the same time, the movable frame 11 can be operated together with the quick fastener 12 without requiring any tool to achieve the quick assembling and disassembling effect, and the size of the placing space 21 can be changed as needed to fit various types of server chasses 3, so as to achieve the effect of improving the convenience of use and operation.

What is claimed is:

1. A quick mount bracket for server chasses, installed in a computer cabinet to form at least one placing space, such that at least one server chassis is stored in the at least one placing space in a straddle sliding manner, the quick mount bracket for server chasses comprising:
   a pair of movable frames, each being formed by stacking two movable plates, such that a relative displacement is produced between the two movable plates to change a length of the pair of movable frames;
   a plurality of quick fasteners, installed to two ends of each of the pair of movable frames respectively, each of the plurality of quick fasteners comprising a plurality of positioning columns configured to be corresponsive to a plurality of mounting holes formed on the computer cabinet, wherein after the length of the pair of movable frames is changed, the plurality of positioning columns is inserted into the plurality of mounting holes respectively, such that the pair of movable frames are respectively and symmetrically installed on two opposite sides of the computer cabinet; and
   a pair of placing plates, each being fixed to an inner side of each of the pair of movable frames, having a side view in an L-shape, and defining the at least one placing space for movably placing the at least one server chassis, wherein
   the quick mount bracket is capable of being removed from the computer cabinet and reinstalled at a different location of the computer cabinet by using the quick fasteners,
   an edge of each of the pair of placing plates is bended to form a wing, so as to form the at least one placing space with the side view in the L-shape, and
   another edge of each of the pair of placing plates is stamped to form a reinforcing folded part for increasing a supporting force along the vertical direction of the pair of placing plates.

2. The quick mount bracket for server chasses according to claim 1, wherein one of the two movable plates comprises a positioning spring plate, and another one of the two movable plates comprises a bracket positioning hole, such that the positioning spring plate is passed through the bracket positioning hole to lock the length thereof.

3. The quick mount bracket for server chasses according to claim 1, wherein each of the plurality of quick fasteners comprises a fixed base, a pair of the plurality of positioning columns is protruded from an end of the fixed base, and the fixed base comprises a fixed part fixed to an end of the pair of movable frames.

4. The quick mount bracket for server chasses according to claim 3, wherein the pair of the plurality of positioning columns is selected from a cylinder, a rectangular column, and a combination thereof, and the pair of the plurality of positioning columns comprises a pair of elastic elements configured to be opposite to the fixed base, the pair of elastic elements are retracted when pressed, and normally remain at a protruding state.

5. The quick mount bracket for server chasses according to claim 1, wherein the surface of each of the pair of placing plates is provided with a plurality of fixing holes to be fixed to the pair of movable frames.

6. The quick mount bracket for server chasses according to claim 1, wherein the reinforcing folded parts are protruded from a surface of the pair of placing plates for reducing the frictional area when putting in the at least one server chassis to make a sliding of the at least one server chassis more smoothly.

7. The quick mount bracket for server chasses according to claim 1, wherein the wings at a position coupled to the pair of placing plates comprise a plurality of reinforcing protrusions which is spaced from each other.

* * * * *